United States Patent [19]
Conturo et al.

[11] Patent Number: 5,281,914
[45] Date of Patent: Jan. 25, 1994

[54] METHOD OF VECTOR MAGNETIC RESONANCE MEASUREMENT AND IMAGING AND ASSOCIATED APPARATUS

[75] Inventors: Thomas E. Conturo, Baltimore, Md.; Bruce H. Robinson, Seattle, Wash.

[73] Assignee: The Johns Hopkins University, Baltimore, Md. ; a part interest

[21] Appl. No.: 743,516

[22] Filed: Aug. 9, 1991

[51] Int. Cl.$^5$ ............................................. G01V 3/00
[52] U.S. Cl. ................................................... 324/309
[58] Field of Search ........................ 128/653.2, 653.5; 324/300, 306, 307, 309, 318, 322

[56] References Cited

U.S. PATENT DOCUMENTS

| | | | |
|---|---|---|---|
| 4,621,234 | 11/1986 | Caprihan | 324/306 |
| 4,766,381 | 8/1988 | Conturo et al. | 324/309 |
| 4,796,635 | 1/1989 | Dumoulin | 128/653 |
| 4,800,889 | 1/1989 | Dumoulin et al. | 128/653 |
| 5,022,397 | 6/1991 | Dumoulin | 128/653 |
| 5,022,398 | 6/1991 | Dumoulin | 324/306 |
| 5,025,788 | 6/1991 | Dumoulin | 128/653 |
| 5,038,783 | 8/1991 | Dumoulin | 324/306 |
| 5,038,784 | 8/1991 | Dumoulin | 128/653 |

OTHER PUBLICATIONS

The Fundamentals of Magnetic Resonance Imaging; Hinshaw et al., Technicare Corp. (1984).
Pelc et al, Optimized Encoding for Phase Contrast Flow Measurement, Soc. of Magn. Reson. in Med., Abstract, p. 475 (1990).
Conturo et al., Accurate Quantitative Imaging or Velocity Magnitude . . . Abstract, SMRM, p. 25 (1987).
Dumoulin et al., Magn. Reson. in Med., vol. 5, p. 47 (1987).
Bernstein et al., General Electric Tech., Report #81, Radiology, p. 176, (Aug., 1990).
Conturo et al., Signal-to-Noise in Phase Angle Reconstruction . . . Magnetic Resonance in Medicine, vol. 15, pp. 420-437 (1990).
Yeung et al., Radiology, vol. 159, pp. 783-786 (1986).
Wedeen et al., Science, vol. 230, pp. 946-948 (1985).
Pelc et al., Measurement of Myocardial Motion Dynamics . . . ABS, 510, Radiology, vol. 177, p. 171 (1990).
Pelc et al., Reduce Scan Time with Improved . . . ABS, 511, Radiology, vol. 177, p. 171 (1990).
Pelc et al. Encoding Strategies for Three-Direction Phase-Contrast MR Imaging of Flow, Jour. of Mag. Res. Imag., vol. 1, No. 4, pp. 405-413 (Jul./Aug., 1991).
Dumoulin et al., Simultaneous Acquisition of Phase--Contrast Angiograms and Stationary Tissue . . . , Jour. of Mag. Res. Imag., vol. 1, No. 4, pp. 399-400 (Jul.-/Aug., 1991).

*Primary Examiner*—Michael J. Tokar
*Attorney, Agent, or Firm*—Arnold B. Silverman

[57] ABSTRACT

A method of vector magnetic resonance measuring and imaging and associated apparatus provide for a specimen being placed in a main magnetic field, RF pulses being impinged thereon, and magnetic field gradients being superimposed thereupon, preferably with three input gradient pulses being impinged preferably simultaneously to construct a balanced system of four gradient vectors having equally strong moments Four cycles of such input gradient pulses are employed to create four magnetic gradient moments from which velocity or motion vectors are created. A receiver obtains signals from a specimen and converts them into information which is introduced into a computer. The computer converts the signals sensitized by the gradient vector moments into motional-type vector information which can be measured and imaged. Different approaches may be taken for low velocity and high velocity usages. In the latter case, as well as others, a null acquisition which does not substantially adversely affect the signal-to-noise ratio may be employed.

55 Claims, 3 Drawing Sheets

METHOD OF VECTOR MAGNETIC RESONANCE MEASUREMENT AND IMAGING AND ASSOCIATED APPARATUS

BACKGROUND OF THE INVENTION

1. Field of the Invention

The present invention provides a method and apparatus for measurement of velocity-type vector information related imaging and, more specifically, it provides such a system which preferably employs substantially tetrahedrally-oriented velocity-encoding gradients.

2. Description of the Prior Art

The advantageous use of non-invasive and nondestructive test procedures has long been known in medical and industrial applications. In respect of medical uses, it has been known that limiting a patient's exposure to potentially damaging x-ray radiation may be accomplished by the use of non-invasive imaging procedures such as, for example, ultrasound energy and magnetic resonance imaging. As to the latter, see generally, The Fundamentals of Magnetic Resonance Imaging by Hinshaw, et al., Technicare Corporation 1984.

In a general sense, magnetic resonance imaging involves providing bursts of radio frequency energy on a specimen that is positioned in a main magnetic field in order to induce responsive emission of magnetic radiation from the hydrogen nuclei or other nuclei. The emitted signal may be detected in such a manner as to provide information as to the intensity and phase of the response and the spatial origin of the nuclei emitting the responsive magnetic signal. The imaging is generally performed in a slice or plane or multiple planes, or three-dimensional volume. The information corresponding to the responsively emitted magnetic radiation is received by a computer which stores the information in the form of numbers corresponding to the intensity of the signal. The pixel value is established in the computer by a Fourier Transformation which converts the in-phase and out-of-phase signal amplitudes as a function of time to complex signal amplitude as a function of frequency. The signals may then be stored in a computer and may be delivered with or without enhancement to a video screen display such as a cathode-ray tube, for example, wherein the image created by the computer output will be presented through either black and white presentations varying in intensity or color presentations varying in hue intensity and saturation. See generally Conturo U.S. Pat. No. 4,766,381.

It has been known to determine velocity by ascertaining the phase shift in the magnetic resonance signal that is induced by motion along magnetic field gradients. If a specific motion-encoding gradient is applied, the resulting phase shift provides a measure of the velocity component along the direction of a specific gradient. It has been known to use a pair of acquisitions for each velocity component, one with and one without the motion-encoding gradient to thereby require a total of six sequential acquisitions, three of which are for the baseline phase. See, e.g. Pelc et al, Optimized Encoding for Phase Contrast Flow Measurement, Soc. of Magn. Reson. in Med., p. 475, Abstracts, (1990). In the 4-point null method one acquisition is without a velocity encoding gradient and the three remaining acquisitions have velocity-encoding gradients of equal magnitude which are sequentially positioned on a different one of the x, y and z axes. See, e.g., Conturo et al, Accurate Quantitative Imaging of Velocity Magnitude and Direction Using Phase-Nulled Orthogonal Bipolar Gradients, Abstract, SMRM, p. 25 (1987). Some of the problems with this approach are that velocity images are electronically noisy as the gradients do not range from a negative to a positive full scale, the image noise is dependent on velocity direction, and data is inefficiently acquired as the null phase adds noise without contributing velocity sensitivity.

Another approach that corrects for baseline phase shifts is the 6-point octahedral technique which corrects without a direct null phase acquisition. See, e.g., Dumoulin et al, Magn. Reson. in Med., Vol. 5, p. 47 (1987). It involves a balanced system because it has gradient vectors all of the same magnitude, whose vectors sum to zero and gradient pairs are in opposing directions along each of the three x, y, z axes. While the 4-point null method may be preferred because of a fewer number of acquisitions, it is still lacking the ideal signal-to-noise ratio.

It has been known to attempt to improve efficiency by providing a method which requires only four acquisitions, three of which have gradients bisecting pairs of x, y or z axes and one which is a direct baseline acquisition. See N. J. Pelc, et al., Optimizing Encoding for Phase Contrast Flow Measurement, Soc. of Magn. Reson. in Med., Book of Abstracts, p. 475 (1990). See also, M. Bernstein, et al., General Electric Technical Report #81, *Radiology*, 176 (August 1990). This system can be considered to be a hexagonal null system which has a null acquisition and three gradient vectors mutually separated by 60 degrees. The three gradient vectors are a subset of a full three dimensional array of vectors as occurs in hexagonal closest packing of spheres. This gradient vector configuration can, therefore, be deemed a 4-point hexagonal null system. This hexagonal null system is not balanced, as the center of the gradient mass is nonzero.

In spite of the foregoing, there remains a very real and substantial need for improving the relative slowness of operation and the undesirable low signal to noise ratio in magnetic resonance imaging of velocity motion and flow vectors.

SUMMARY OF THE INVENTION

The present invention provides a method of vector magnetic resonance measurement and imaging which includes providing a specimen in a main magnetic field, generating RF signals and a cycle of operation of a plurality of magnetic field input gradients time coordinated with the RF signals. The signals are received from the specimen responsive to the RF pulses and magnetic field input gradients, and emit responsive output magnetic signals which are delivered to receiver means that provide corresponding electrical signals to computer means. At least four input gradient cycles of operation are employed to provide four net-time accumulated gradient vector moments that are of generally equal magnitude and balance to achieve a substantially tetrahedral configuration. The computer employs the information received to create a velocity or motional vector from which it determines velocity or other motional characteristics.

The input gradient moments are so selected in respect of strength and duration as to create four generally equally strong gradient vector moments from which velocity is ultimately determined.

The method may be employed on various types of subjects, including human beings wherein it is desired to measure the velocity of fluid flow within the body, such as blood flow, for example.

The method is adapted in one embodiment to be employed in a gradient-limited mode and, in another embodiment, to be employed in the wraparound-limited mode.

Apparatus for performing these functions is also provided

It is an object of the present invention to provide a magnetic resonance measurement of motional-type information and imaging thereof, and associated apparatus which will facilitate the rapid quantification of vector velocity in a manner that provides desired information with high precision imaging contrast.

It is another object of this invention to provide such a system that employs geometrically-balanced acquisitions.

It is a further object of the present invention to provide such a system which has a high signal to noise ratio.

It is another object of the invention to provide such a system which eliminates the dependence of noise on velocity direction.

It is another object of the present invention to provide such a system which will permit shorter scanning times while providing the desired velocity or other motional information, such as acceleration information.

It is another object of the present invention to provide such a system which may be used in a wide variety of medical and nonmedical applications, including imaging of blood vessels and the fluid dynamics of blood flow, imaging of other body fluid flow, imaging of tissue or organ motion, as well as imaging of perfusion.

It is a further object of the invention to provide such a system which may be used to efficiently measure or image low velocity information as well as high velocity information.

It is another object of the invention to provide such a system which may be used either with signal magnitude reconstruction or phase angle reconstruction, depending upon the application.

It is another object of the present invention to provide such a system that is capable of effecting a meaningful increase in a net gradient strength without requiring hardware modifications.

It is a further object of the present invention to provide such a system employing four gradient vectors of equal magnitude in the first moment or higher moment (herein collectively referred to as "moment" depending on the application) that are balanced in three dimensional space.

These and other objects of the invention will be more fully understood from the following description on reference to the illustrations appended hereto.

DESCRIPTION OF THE PREFERRED EMBODIMENTS

As used herein, the terms "specimen" or "test specimen" shall refer to any object placed in the main magnetic field for imaging and shall expressly include but not be limited to members of the animal kingdom, including humans; test specimens which are biological substances, such as biological tissue and blood vessels removed from such members of the animal kingdom; and inanimate objects that may be analyzed by NMR or contain water or sources of other sensitive nuclei.

Figure 2:
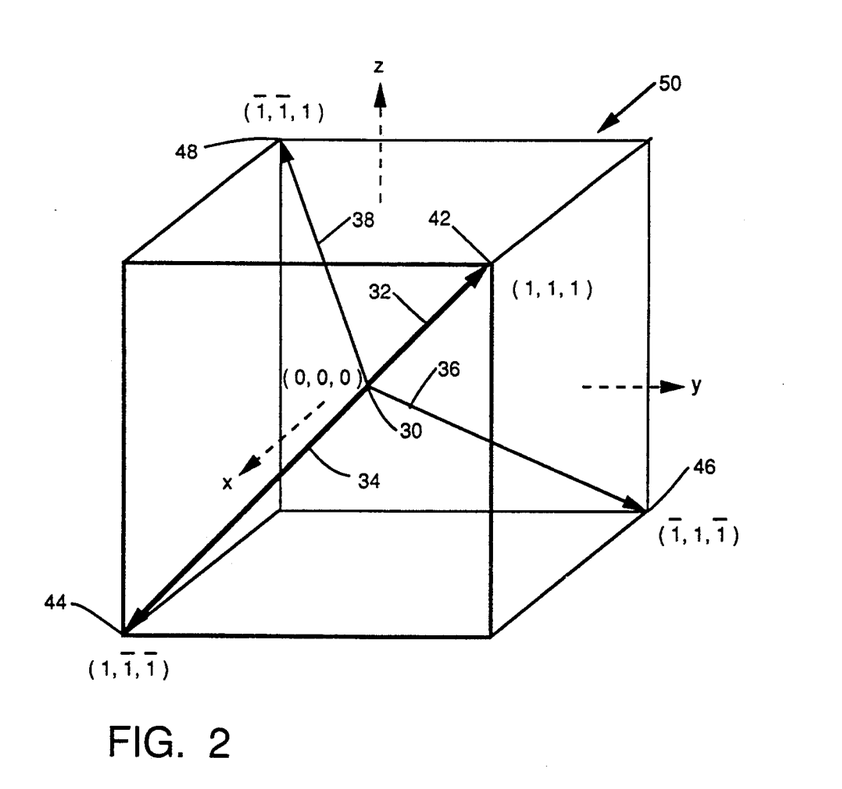
FIG. 2 is a schematic illustration of the preferred embodiment of the present invention showing the magnetic field vectorial relationships in the tetrahedral method.

The term "tetrahedral" as used herein shall refer to gradient vectors oriented in a manner as exemplified in FIG. 2, rather than a solid object having four triangular faces.

As employed herein the expression "balanced tetrahedral" method means a gradient vector configuration having four vectors of equal first moment magnitude (or equal higher order moment magnitude depending on the application), each having a component on the x, y and z axes and the set of vectors having a center of gravity at the origin.

Figure 1:
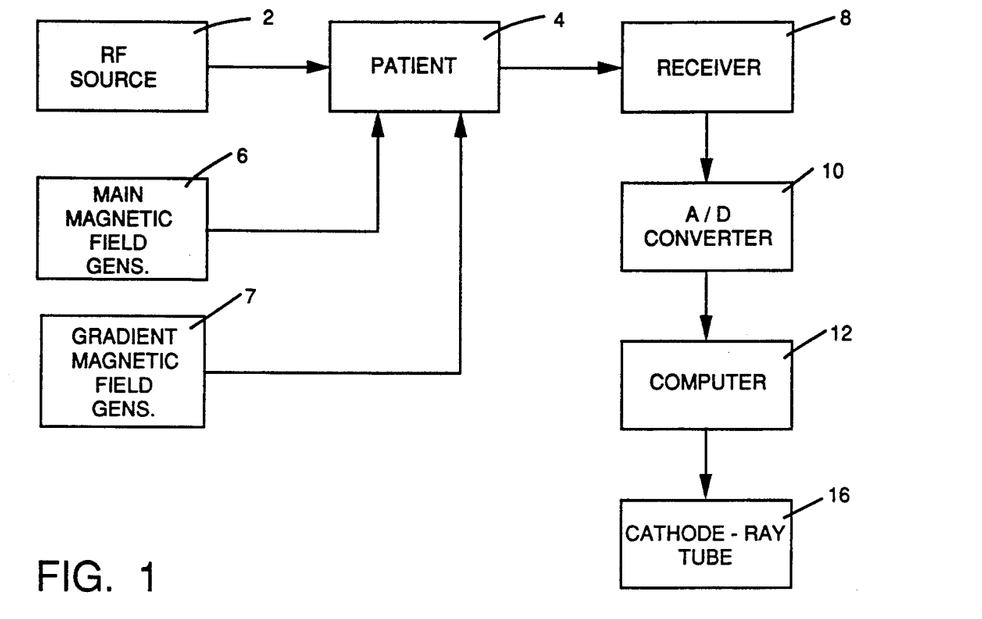
FIG. 1 is a schematic illustration of a magnetic resonance imagingsystem

FIG. 1 is a schematic illustration which illustrates the general concept of magnetic resonance imaging as modified herein. RF Source 2 provides a pulse of radio frequency energy to the specimen 4, which in the form shown is a human patient placed in the main magnetic field, which is on continuously. The specimen 4 is generally aligned with the magnetic field, herein called the physical z axis direction, and the RF pulses are imposed generally perpendicular thereto along the physical x and y dimensions. The main magnetic field is generated by main magnetic field generator 6. The pulse from RF source 2 results in excitation of the nuclei within the area or volume to be imaged and causes responsive emission of magnetic energy which is picked up by receiver 8. Logical x, y, and z axes, which represent the axes of the imaging plane or volume, may or may not coincide with the physical hardware x, y, and z axes.

Magnetic field gradient generator means 7 provide gradients causing the main magnetic field created by generator 6 to be incremented or decremented as a function of position. These gradients may be applied at any time and at any strength, and generally are applied in directions to endow the emitted energy with information on spatial location, velocity or other properties. The magnetic field gradient generator means 7 will preferably consist of three gradient generators which are each so positioned as to each be employed to create a gradient on a different one of the physical x, y, and z axes. The z axis gradient will be coaxial with the main magnetic field established by main magnetic field generator 6 and the other two axes will be the x, y axes which are orthogonal thereto. When the gradient generator 7 is employed to create a tetrahedral gradient, it is generally preferred to have the three physical gradients applied substantially simultaneously (although they may be applied sequentially) preferably between the time of the first RF pulse and the data acquisition by the receiver 8. The creation of the three velocity-encoding input gradients simultaneously or substantially simultaneously serve to increase sensitivity. In the preferred embodiments the integrated resultant moments produce the desired tetrahedral configuration.

The receiver 8 may be a coil which has a voltage induced in it as a result of such responsive emission of magnetic energy. As a practical matter, separate coils or identical coils may be employed as the RF source 2 and the receiver 8. The signal emerging from the receiver 8 passes through the analog-to-digital (A/D) converter 10 and then enters computer 12. Within the computer, Fourier Transformations of signals convert the plot of in-phase and out-of-phase amplitude versus time to a map of the distribution of complex number signals from which can be plotted the real, imaginary, magnitude, or phase angle output from the Fourier Transforms versus frequency or position. The Fourier Transformations are performed in order to establish the intensity values and locations of the specific pixels. These values may be stored, enhanced or otherwise processed and emerge to be displayed on a suitable screen, such as a cathode-ray tube 16.

The present system contemplates employing a balanced tetrahedral gradient vector system and making a determination of velocity or motional information with imaging of the same, if desired. The RF generator will emit a pulse shorter before, during, or preferably prior the three input gradient magnetic field generators applying a magnetic gradient to each of the logical imaging x, y, z axes to create a tetrahedrally-oriented gradient moment of the type shown in FIG. 2. This cycle is performed at least four times in order to create four magnetic gradient moments which velocity-sensitize the signals and which are received by computer 12 through receiver 8 and A/D converter 10. The imposed input magnetic field gradients will each have a corresponding plus or minus direction depending upon which of the four tetrahedrally-oriented velocity encoding gradient vectors of FIG. 2 is to be constructed. Each of the four cycles, therefore, will provide the gradient moment information needed for the computer to construct the projection of the actual velocity vector along one of the tetrahedral directions in FIG. 2. The four cycles provide the information needed to enable reconstruction of the actual velocity vector which is the velocity magnitude and full directional information. The expression "magnetic gradient moment" is employed so as to embrace a combination of the input gradient magnetic field strength and the duration thereof and applies to either the first or higher moment depending on the application. Such moments can be superimposed onto routine imaging magnetic field gradients which may be simultaneously operational. It will be appreciated by those skilled in the art that the desired moment may be achieved in many ways by determining the combination of strength and duration needed to achieve a particular moment. Also, the input gradients need not be identical in that they need not have the identical gradient profiles. It is preferred that the four resultant magnetic gradient moments be identical or substantially identical.

It will also be known to those skilled in the art, that once the specific orientation of a single velocity encoding magnetic gradient vector, such as, for example, ($\bar{1}$, $\bar{1}$, 1) has been selected the other vectors will be automatically determined as to orientation in order to achieve the desired tetrahedral configuration. As this invention involves a balanced system, all gradient moments will be of the substantially same magnitude and originate at the origin 30 of FIG. 2.

While for simplicity of disclosure herein, the system has been disclosed as having the computer generate the velocity vectors after each four cycles of data acquisition, it will be appreciated if desired such as in double-echo imaging that sufficient data may be acquired using less than four pulse sequence repetition cycles.

As shown in schematically in FIG. 2, a preferred embodiment of the present invention involves a tetrahedral configuration of gradient vectors which are balanced in three dimensional space represented by the cartesian coordinates x, y, z. The center of mass of this system is at the origin 30. The gradient vectors 32, 34, 36, 38 are composed of combinations of input x, y, z gradients which are preferably applied simultaneously. With reference to FIG. 1, three gradient magnetic field generators 7 would apply input magnetic gradients substantially simultaneously and generally after the application of RF pulses using either positive or negative gradient strengths for a time duration and of a constant or time-varying strength required to achieve the desired magnetic gradient moment for sensitizing the signals to the desired motional property.

In order to generate four responsive gradient vector moments responsive to the input magnetic field gradients applied along the logical x, y, z coordinates, four cycles of operation of the RF generator 2 are employed. Each cycle of the RF generator 2 results in one block of information which is delivered to computer 12. After four cycles of operation of RF generator 2, the four resulting signals sensitized along tetrahedral directions are converted to motional-type vector information by the computer and, if desired, imaging thereof may occur.

It will be appreciated, therefore, by noting the tetrahedrally oriented velocity encoding gradient vectors each extending from origin 30 to the four cube vertices 42, 44, 46, 48 that the net physical gradients imposed along tetrahedral directions will each have x, y, z components along these three logical axes. The moment magnitudes of each input x, y, z gradient components are constant and in FIG. 2 have been shown to have the value 1. (The numbers which have a horizontal line overlying them are representative of an input gradient component applied in the negative direction while numbers without such a line indicates a positive direction with respect to the coordinate axes.) Vector 32 has component values of positive 1 with respect to all three of the coordinate axes x, y, z. Vector 34 has a positive 1 value in the x direction and negative values in the y and z directions. Vector 36 has a negative value with respect to the x and z axes and a positive value with respect to the y axis. Finally, vector 38 has a negative value with respect to the x and y axes and a positive value with respect to the z axis. In the illustrated embodiment, each of the vectors, 32, 34, 36, 38 will be separated from the adjacent vectors by 109° 28'. Alternatively, the four gradient vectors could have been applied along ($\bar{1}$, 1, 1), (1, $\bar{1}$, 1), (1, 1, $\bar{1}$) and ($\bar{1}$, $\bar{1}$, $\bar{1}$) with the same result.

The information gathering portion of the invention will be essentially as shown in FIG. 1 with the understanding that one RF generator 2 will apply pulses (which may or may not involve a quadrature coil) with or without the application of routine imaging gradients for slice selection in the logical z direction followed by the generation of a tetrahedral velocity encoding gradient by the application of three orthogonal magnetic field generators 7 which are preferably applied simultaneously, but may be applied sequentially provided that all three gradients are applied prior to application of receiver 8. Each of the three gradient generators of generator means 7 applies a gradient along one of the three coordinate axes which combine to produce a time summated gradient moment vector given by one of the vectors 32, 34, 36, 38 in FIG. 1. Data is repetitively acquired in this manner through four cycles of input gradient-RF pulse operation to eventually generate data sensitized along the four gradient vectors 32, 34, 36, 38 in FIG. 2. The manner in which this sensitive received information will be processed in the computer means 12 in accordance with the present invention will be discussed specifically hereinafter.

It will be appreciated that while the disclosure herein has focused on the preferred tetrahedral embodiment, it will be understood that the invention may be employed with a different number of gradient vectors while, otherwise, employing the method and apparatus of the invention. For example, by employing five cycles of the input magnetic field gradients, a balanced gradient array of five gradient vectors uniformly distributed in three-dimensional space, otherwise, generally similar to FIG. 2 will be created. The use of the fifth cycle of input gradients would require slightly greater acquisition time.

Figure 3:
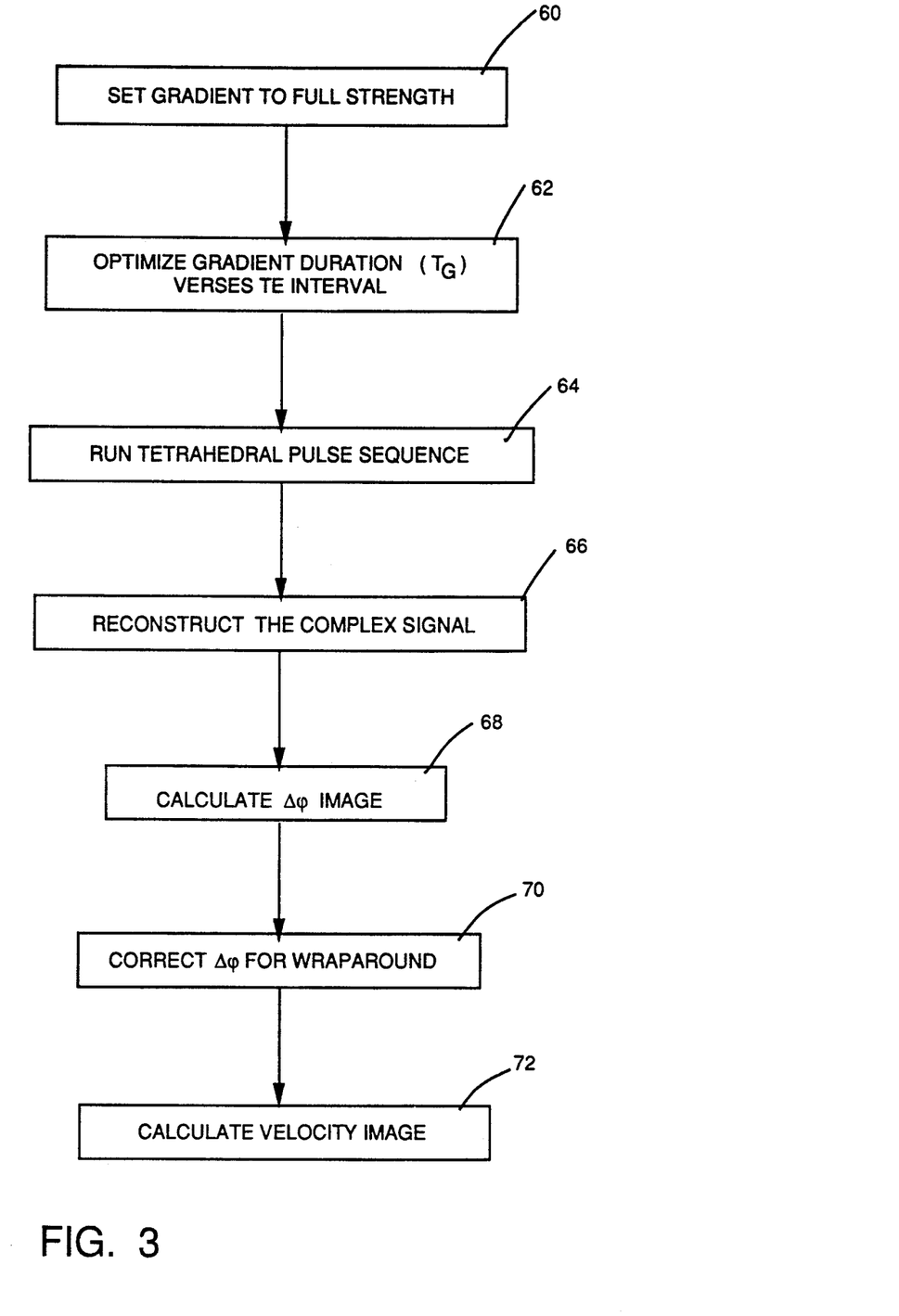
FIG. 3 is a schematic flow diagram illustrating a preferred embodiment of the present invention in the gradient-limited mode.

In general, the gradient-limited mode of operation illustrated in FIG. 3 will preferably be employed for low velocity applications and, if short TE intervals (the time from the initial RF pulse to the received echo pulse) are available (e.g. 3 ms), will also be employed for high velocity applications. In the latter case, velocities on the order of about 130 cm/sec or less would be involved. In the former case, using a TE of 40 ms, velocities on the order of about 3 cm/sec or less, can be measured or imaged. The embodiment of FIG. 4 will be employed for what might be considered high velocity applications using intermediate TE intervals, e.g. 40 ms, wherein the concept is wraparound limited. The general concept of wraparound is disclosed in Conturo, et al., Signal-To-Noise In Phase Angle Reconstruction: Dynamic Range Extension Using Phase Reference Offsets, Magnetic Resonance in Medicine, Vol. 15, pp. 420–437 (1990).

Referring to FIG. 3, the low-velocity or gradient-limited mode embodiment of the invention will be considered. This embodiment applies for usages such as measuring or imaging perfusion or cerebrospinal fluid (CSF), for example, and in situations where short TE intervals (the time between the initial RF pulse and the echo pulse) are used, such as the imaging of arterial and venous blood flow, for example.

As shown in FIG. 3, the first step 60 is to set the gradient strengths of each of the input logical x, y and z gradients to the maximum that the hardware will permit. These input gradients combine to make net gradients that are generally stronger and have a generally tetrahedral configuration as in FIG. 2. The gradient duration can be maximized 62 in order that the velocity-encoding gradient moments will be maximal which, in the simplest case of a bipolar gradient-time profile, amounts to maximizing the strength times the duration of the gradient ($T_G$) squared. If the durations are too long, the TE interval will be long and the inherent MR signal-to-noise ratio will be degraded by the signal decay caused by spin-spin or $T_2$ relaxation, which will tend to offset the advantage gained by maximizing the gradient moments. Velocity-to-noise ratio is proportional to the MR signal-to-noise ratio. As a result, the gradient duration $T_G$ at reference box 62 is maximized taking into account the TE effect. After the gradient moments and signal-to-noise ratio are maximized, the pulse sequence can be run with assurance that no undesired wraparound will occur, or at most, a minor amount of wraparound will occur which can readily be corrected by means known to those skilled in the art. See, e.g., Conturo et al, Magn. Reson. Med., Vol. 15, pp. 420–437 (1990) or Yeung et al, Radiology, Vol. 159, pp. 783–786 (1986). The gradient strength and duration level may readily be set prior to data acquisition in order to set the imaging range to the low velocities of interest. Also, the gradients can be adjusted in the wraparound limited mode to allow both low and high velocities to be measured or imaged, or in this case, two separate acquisitions may be employed, one for the low velocities and one for the high velocities. Similarly, if only the high velocities are of interest, then just the high velocity acquisitions may be employed.

The sequence can then be run as shown in reference 66. In stage 68, the complex signal is reconstructed from which images may be generated which include images of phase angle ($\phi$) signal magnitude, the real signal, or imaginary signal. The real and imaginary signals represent, respectively, the signals which are in phase and out of phase with respect to a reference oscillator. Reconstruction of phase may be preferred because of the signal-to-noise ratio considerations discussed in Conturo et al, Mag. Reson. Med., Vol. 15, pp. 420–437 (1990). However, a magnitudere-constructed image can be obtained. This magnitude reconstructed image can be made sensitive to the phase. See, generally, Dumoulin et al, Mag. Reson. Med., Vol. 5, p. 47 (1987) and Weeden et al, Science, Vol. 230, pp. 946–948 (1985). For convenience of reference, the phase angle reconstruction and velocity imaging have been specifically disclosed in detail herein. In step 68, the $\Delta\phi$ image, which is the net accumulated phase change, is generated here by direct subtraction from the $\phi$ images created in step 66, or by using the various images in 66 to calculate corresponding complex images and then using complex algebra.

The $\Delta\phi$ image will not have undesired wraparound as low velocities are imaged. If the gradient moments are high enough, however, this image can have one or two wraparounds just as in images disclosed in Conturo et al, Mag. Reson. Med., Vol. 15, pp. 420–430 (1990). The presence of these few wraparounds does not necessarily mean that one must use the wraparound-limited mode as a few wraparounds can be corrected by means previously known at reference 70. The orthogonal velocity components and the velocity magnitude and direction may be computed in the step 72 from the $\Delta\phi$ in step 70.

Figure 4:
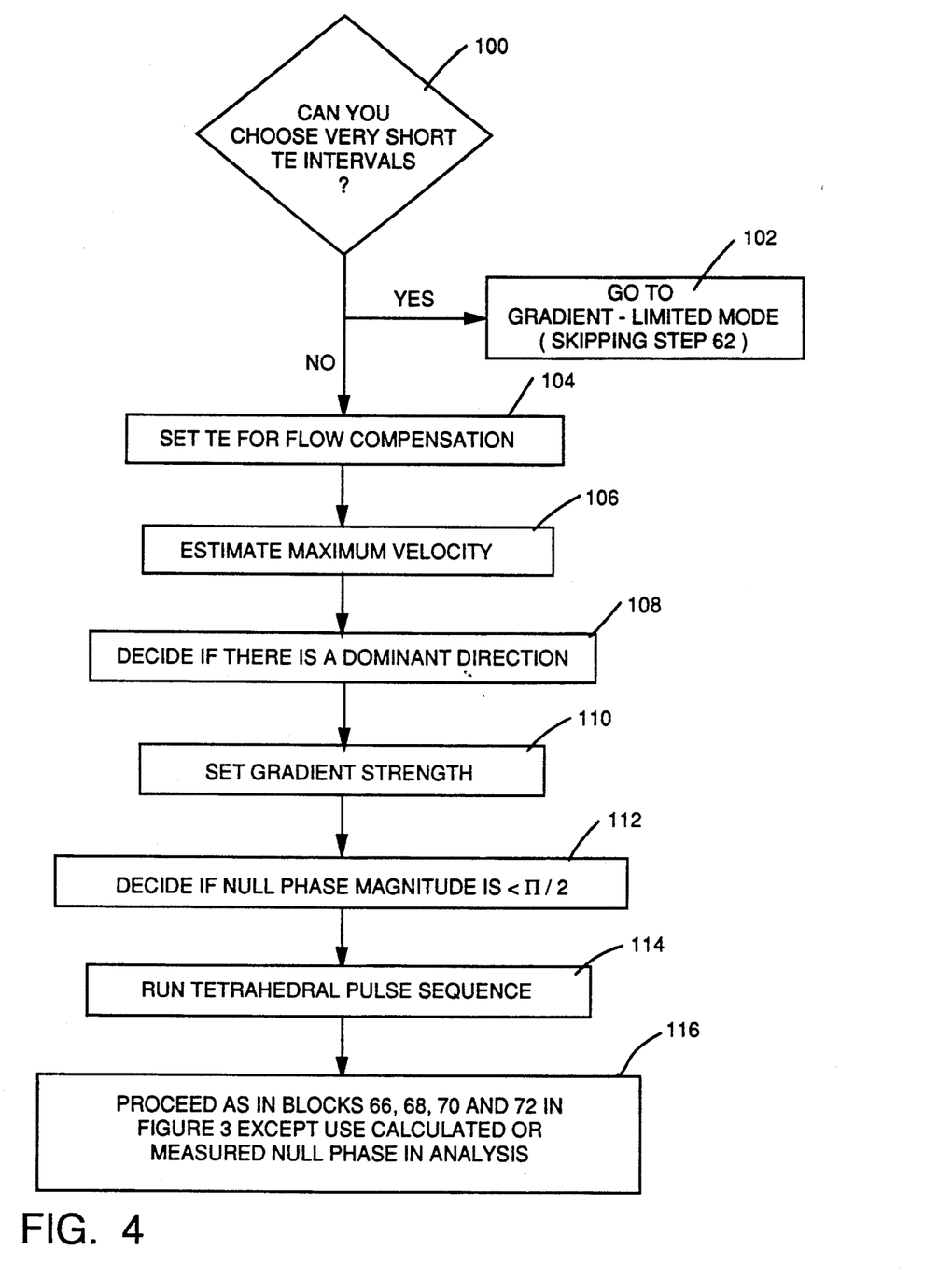
FIG. 4 is a schematic flow diagram illustrating a preferred embodiment of the invention in the wraparound limited mode.

Referring now to FIG. 4, the high velocity or wraparound-limited embodiment will be considered. This approach may be employed for measuring and imaging flow in arteries and veins or motion in tissues or organs, for example. The initial inquiry is whether or not the hardware will allow very short TE intervals, for example, on the order of about 10 ms or less. If it will, then there may be advantages in using the short TE intervals in order to minimize dephasing, minimize $T_2$ relaxation and thereby maximize the MR signal-to-noise ratio which will in turn result in maximizing the velocity-to-noise ratio. Short TE intervals, however, limit gradient durations $T_G$ and, as a result, limit the maximum gradient moment strength, but there are few advantages in the use of high gradient moments in the high velocity case as higher moments tend to multiply the undesired wraparounds. If sufficiently short TE intervals can be used, the low velocity gradient limited mode is entered and step 62 of FIG. 3 is bypassed because TE is to be set near the minimum value. If short TE intervals are not available, the wraparound-limited embodiment is employed. The inquiry is shown as stage 100 in FIG. 4 with the diversion to low velocity cases being indicated as 102 and the wraparound limited mode being started by the setting of TE for flow compensation at 104. If short TE intervals are not available, flow compensating gradients are preferably employed. In step 104, the TE is set to allow time for operation of these flow compensation gradients. Subsequently, the maximum velocity of interest is estimated 106 before data acquisition. From this estimate, the gradient strength and/or duration is set in order that the maximum velocity will be just below the wraparound threshold in order to resist undesired wraparounds. If correction algorithms are employed in the software so as to unwrap a limited number of wraparounds, the gradient strength is set so the maximum velocity will produce only at most the maximum number of wraparounds that can accurately be corrected.

In step 108, it is determined whether or not there are one or two dominant velocity directions, e.g. imaging of flow in straight vessels or curved vessels, such as the aortic arch. If so, the input x, y and z gradient strengths may be increased somewhat with the same protection against undesired wraparound. From the steps 106 and 108, the final input gradient strengths are determined in step 110. A further decision is made in step 112 before acquiring data, and that is whether the null phase ($\phi_n$) is generally within the $-\pi/2$, $\pi/2$ interval. If it is, then $\phi_n$ can be calculated from the four data acquisitions represented by FIG. 2. If it is not, $\phi_n$ may be directly acquired using a five acquisition tetrahedral pulse sequence having an acquisition represented by (0, 0, 0) which is the origin 30 in FIG. 2.

The pulse sequence is run in step 114 with or without a direct phase null acquisition based on the decision in step 112. The images are then reconstructed and analyzed 116 as in steps 66, 68, 70 and 72 of the low velocity embodiment. The primary difference between the high velocity or wraparound-limited mode embodiment and the low velocity or gradient-limited mode embodiments is that the calculated or measured $\phi_n$ is used in the complex number calculation step 68.

As indicated, the present system employs a balanced method. In general, balanced methods offer a number of advantages over unbalanced methods. First, gradient moments can be made to go from positive maximum value to negative maximum value in the first embodiment or gradient-limited case. This doubles the change in the moments associated with a particular component velocity encoding gradient between the two acquisitions employed to calculate velocity. This results in a reduction in velocity noise. A further advantage of the balanced method is that the effects of null phase errors will automatically be corrected without having to acquire the null phase. In addition, this approach offers the further benefit of the velocity noise being independent of the velocity direction. A further advantage of the balanced system is that in the wraparound-limited mode, the null phase can be measured or calculated in order to enable gradient moment ranges to be doubled as in the gradient limited embodiment, thereby extending phase angle ranges and reducing velocity noise without adding the noise in the null phase.

In the tetrahedral embodiment shown in FIG. 2, the four gradients $G_1$, $G_2$, $G_3$ and $G_4$, which are represented respectively by vectors 32, 38, 34, 36, encode the velocity vector and point from the center of the cube at (000) to the four cube vertices 42, 48, 44, 46, of cube 50. As a result, the gradients are constructed from the combinations of the physical or logical x, y, z gradients as represented by the four vectors 32, 34, 36, 38. The gradients may be mathematically written as formulas [1a] to [1d]

$$G_1 = G_x i + G_y j + G_z k \qquad [1a]$$

$$G_2 = -G_x i - G_y j + G_z k \qquad [1b]$$

$$G_3 = G_x i - G_y j - G_z k \qquad [1c]$$

$$G_4 = -G_x i + G_y j - G_z k, \qquad [1d]$$

wherein $G_1$, $G_2$, $G_3$, and $G_4$ are the four tetrahedral magnetic field gradients 32, 38, 34 and 36, as shown in FIG. 2; $G_x i$, $G_y i$, and $G_z i$ are the input orthogonal logical or physical gradient vectors produced by the gradient hardware and used to construct the tetradedral gradients. Negative signs indicate that gradients are applied in negative directions.

All of the input gradients have identical gradient moment strengths so that the input gradient amplitudes $G_X$, $G_Y$, and $G_Z$ may be equal and may be considered as being $G_O$ in order that the time profiles of the x, y, and z gradients may be identical. As a result, the magnitudes of the resultant gradients $G_1$, $G_2$, $G_3$ and $G_4$ are increased over the input gradient magnitudes without making any hardware modifications so that $G_1$, $G_2$, $G_3$ and $G_4$ will all equal $G_O$ times the square root of 3.

For each of the four acquisitions, there is a corresponding phase angle measurement or set of phase angle pixel values and these phase angles will include both the non-specific phase shifts due to motion through routine imaging gradients, i.e. the null phase, and specific phase shifts due to motion through the actual velocity encoding gradients; the latter specific phase shifts are the ones that are proportional to velocity. These may be determined by the set of relationships represented by the vector expression shown in formula 2

$$\Delta\phi_i = \phi_i - \phi_n = \gamma M_i V, \qquad [2]$$

wherein $\Delta\phi_i$ is the specific phase shift corresponding to the i-th tetrahedral gradient; $\phi_i$ is the actual phase angle reconstructed from data sensitized to velocity using the i-th tetrahedral gradient; $\phi_n$ is the null phase; $\gamma$ is the gyromagnetic ratio that is an inherent physical property of a nucleus and, for hydrogen, is 26753 gauss$^{-1}$ sec$^{-1}$; $M_i$ is the vectorial first moment of the i-th tetrahedral gradient; V is the velocity vector that is to be measured or imaged, and i has the value 1, 2, 3, or 4. The x, y, and z velocity component can be determined in accordance with the expressions set forth in Equations [3a] through [3c].

$$V_x = \frac{\phi_1 - \phi_2 + \phi_3 - \phi_4}{4\gamma M_o} \qquad [3a]$$

$$V_y = \frac{\phi_1 - \phi_2 - \phi_3 + \phi_4}{4\gamma M_o} \qquad [3b]$$

$$V_z = \frac{\phi_1 + \phi_2 - \phi_3 - \phi_4}{4\gamma M_o}, \quad [3c]$$

wherein each of the $\phi$ values are phase angles acquired using a particular tetrahedral gradient vector designated 1, 2, 3, or 4 as given in Equation 1; $M_o$ is equal to the magnitudes of the input orthogonal x, y and z gradient moments so that $M_x = M_y = M_z = M_o$; and $V_x$, $V_y$, and $V_z$ are the orthogonal velocity components. All of the $\phi_n$ terms in the set of equations represented by the vector equation 2 cancel in equation 3 so that the null phase is implicitly corrected as expected for a balanced method.

Considering first the gradient-limited or low velocity case, the input gradient moments $M_X$, $M_Y$, $M_Z$, will each be equal to $m_{max}$. The value of $m_{max}$ is the maximum gradient moment determined by the optimization in 62 of FIG. 3 or in the short TE high velocity case as results when turning gradients to maximum strength for the maximum duration allowed by the short TE interval. The four tetrahedral gradient moments corresponding to each vector 32, 34, 36, 38 will each have a strength equal to the square root of 3 times $m_{max}$. It will be appreciated that this improvement is accomplished without making any hardware change. The variances in velocity components of Equation 3 may be determined by the relationship set forth in Equation 4

$$\sigma^2_{tet}(V_i) = \frac{\sigma^2(\phi_1) + \sigma^2(\phi_2) + \sigma^2(\phi_3) + \sigma^2(\phi_4)}{(4\gamma M_o)^2}, \quad [4]$$

wherein $\sigma$ represents the standard deviation which is equal to noise, $\sigma^2_{tet}(V_i)$ is the variance or squared value of the noise in the measured or imaged i component of velocity for the tetrahedral method and $i = x$ or y or z. The phase angle noise is independent of the actual phase angle and, therefore, all phase variances in Equation 4 will be equal to the inherent phase angle variance $\sigma^2(\phi_0)$. The variance in velocity magnitude will then be determined by Equation 5.

$$\sigma^2_{tet}(V) = \frac{4}{(4\gamma M_o SNR_I)^2}, \quad [5]$$

wherein $\sigma^2_{tet}(V)$ is the variance in velocity magnitude and $SNR_I$ is the signal-to-noise ratio that would occur if the signal from one of the four tetrahedrally-sensitized acquisitions were magnitude-reconstructed instead of phase-angle reconstructed.

It will be appreciated that in this manner the four cycles of input of the three gradient moments along the coordinate axes results in four gradient vectors which are balanced and uniformly positioned in three-dimensional space providing accurate readings of velocity.

Among the benefits of the balanced method of the present invention are the direction-independent velocity noise, the fact that the gradients do span the full plus minus range in respect of the coordinate references, the avoidance of a required null acquisition that adds noise while not contributing velocity sensitivity, and the possibility for extension of the phase angle ranges in the wraparound case by an additional acquisition as further discussed hereinafter. In comparison to equation 5, the variance expression for the prior art hexagonal null method has only a factor of 2 in parentheses in the denominator, while the expression for the octahedral method has values of 2 in place of the values of 4 that are in equation 5. Comparing the preferred system of the present invention with the prior art shows that the signal-to-noise ratio is approximately 2.83 times that of the orthogonal 4 point null system. The present improvement results in a reduction of total scan time by a factor of 8 for a given velocity-to-noise ratio. This is due at least in part to the fact that the four gradient moments of the present invention are the square root of 3 times stronger than those of the orthogonal 4 point null system.

While not preferred, if desired, one may detect or image motion in only two dimensions, e.g., the x and y axes. To do this, the third input gradient component (e.g. the z axis) can be eliminated to produce a square planar gradient configuration.

The wraparound limited case wherein high velocity-arterial or venous flow is measured or imaged using high order compensation gradients that rephase the signal and that require intermediate TE intervals will be considered. In this embodiment the velocity-to-noise ratio per unit of time (SNR$v$) is a function of the calculated net phase range angle which is the numerator in Equations 3[a] to [3c]. Selection of the gradient moments, however, can in some instances be limited by phase wraparound. When the phase angle images are individually reconstructed, the wraparound can be particularly severe in balanced methods such as the present method where gradient amplitudes span from negative to positive. Such wraparound limits the range in the net reconstructed phase shifts thereby limiting the velocity-to-noise ratio per unit time and may require that balanced gradient moments to be reduced relative to the non-balanced gradients to prevent wraparound. With the present invention, the gradient moments need not be reduced in such a manner and wraparound can be minimized while improving the signal-to-noise ratio per unit time. These advantages can be accomplished in computing the orthogonal velocity component on each coordinate axis x, y, z by introducing an acquired or calculated $\phi_n$ term into Equation 3 to produce Equation 6[a] through [6c].

$$V_x = \frac{[(\phi_1 - \phi_n) - (\phi_2 - \phi_n)] + [(\phi_3 - \phi_n) - (\phi_4 - \phi_n)]}{4\gamma M_o}, \quad [6a]$$

$$V_y = \frac{[(\phi_1 - \phi_n) - (\phi_2 - \phi_n)] - [(\phi_3 - \phi_n) + (\phi_4 - \phi_n)]}{4\gamma M_o}, \quad [6b]$$

$$V_z = \frac{[(\phi_1 - \phi_n) + (\phi_2 - \phi_n)] - [(\phi_3 - \phi_n) - (\phi_4 - \phi_n)]}{4\gamma M_o}, \quad [6c]$$

wherein Vx, Vy and Vz are the orthogonal velocity components, $\phi_1$, $\phi_2$, $\phi_3$ and $\phi_4$ are each phase angles that are sensitized by tetrahedral gradient vectors, and $M_O$ equals the magnitude of the gradient moment along each of the x, y, and z coordinate axes. The $\phi_n$ terms will cancel and, therefore, the $\phi_n$ calculation or acquisition does not add to velocity noise.

Gradient moments are chosen so that paired phase angle differences in parentheses are within the minus $\pi$ to plus $\pi$ interval. These chosen gradient moments are generally higher than if each individual phase angle in Equation 3 were required to be in the minus $\pi$ to plus $\pi$ interval which would be the case if phi$_n$ were not calculated or measured. The null phase will, therefore, serve to reduce phase angle wraparound, enable gradient strengths to be increased and increase the signal-to-noise ratio of the measurement and imaging of motional-type information. All of this is accomplished while making the null acquisition transparent in that it does not add to velocity noise.

It will be appreciated that in the high velocity embodiment, when the maximum velocity to be measured is known, the gradient moment can be selected to cause phase shifts just below the threshold for wraparound.

If the phase angle $\phi_n$ is generally less than $\pi/2$, the null phase can be calculated. Otherwise the null phase can be measured without increasing the velocity noise, thereby keeping the null acquisition transparent.

The improvement in signal-to-noise ratio of the present invention can, if desired for particular uses, be employed as a tradeoff for shorter acquisition times, or higher spatial or temporal resolution or other desired features. This option is of particular value in measuring flow within a blood vessel.

Referring again to FIG. 1, the apparatus of the present invention will have main magnetic field generating means 6 for establishing a main magnetic field on a specimen 4. An RF signal generating means 2 will emit pulsed RF signals to at least a portion of the main magnetic field passing through the specimen. Gradient magnetic field generating means 7 will preferably have three gradient generators each aligned with one of the physical x, y, z coordinate axes for establishing three input gradients of equal net accumulated gradient moments. These input gradients are preferably applied substantially simultaneously. The gradient generating means will establish four sequentially related magnetic gradients of equal net moment strengths, with balanced net moment vectors. Processing the information acquired by receiver means 8 and introduced into computer 12 through A/D converter 10 may occur in accordance with the preferred approach employing the software to be disclosed herein. The measured velocity information may be imaged by any suitable means such as cathode-ray tube 16, for example. The computer means 12 will preferably also control and coordinate operation of the RF source 2, main magnetic field generator 6, and gradient magnetic field generator means 7 or separate computer means can be used for this purpose.

In order to disclose the best mode known to applicants for practicing the invention, a listing of the preferred software is provided in the SOFTWARE LISTING appended hereto, along with associated textual descriptions that will indicate the significance of various segments of the software and the conditions under which the software will be preferred. While it will be appreciated that modifications may be made to this software while still achieving the benefits of the present invention, this is the presently preferred approach.

The computer means 12 has logic means which controls the timing, signal processing as well as operation of the magnetic fields, gradients and RF pulses. As the specific hardware usable in the present invention may be of any known conventional type or other type for use in respect of imaging employing the invention, disclosure of the same need not be provided herein in detail.

It will be appreciated that the present invention increases magnetic gradient strength by a factor of the square root of 3.

While emphasis herein has been placed upon the use of magnetic resonance measurement and imaging with reference to spin echo imaging, it will be appreciated that the present invention is not so limited. More specifically, the invention may be used with other types of magnetic resonance imaging such as gradient echo or echo planar imaging, sensitive-point methods, decomposition of the MR signal into chemical spectral components and "velocity zeugmatography" which employs stepped velocity encoding gradients to resolve velocity distributions and other presently known or future created approaches.

While for convenience of disclosure, reference has been made herein to magnetic input gradients employed in the present invention, it will be appreciated that these gradients may be superimposed on routine imaging gradients, if desired.

When reference is made herein to velocity imaging, it will be appreciated that such reference embraces the use of the velocity determination in the context of other measurements and imaging thereof, such as in volume flow measurement and imaging, or in acceleration imaging, for example.

Whereas particular embodiments of the present invention have been described herein for purposes of illustration, it will be appreciated by those skilled in the art that numerous variations of the details may be made without departing from the invention as described in the appended claims.

We claim:

1. A method of vector magnetic resonance measurement comprising
    providing a specimen disposed within a main magnetic field,
    creating pulsed RF signals within said specimen,
    generating in one cycle of operation a plurality of pulsed magnetic field input gradients and delivering them to said specimens generally simultaneously,
    employing at least four input gradient cycles of operation, with at least four gradient vectors having net-time accumulated magnetic field gradient vector moments that are of generally equal magnitude and balanced receiving signals by receiver means from said specimen responsive to said RF pulses and said input gradient cycles and emitting responsive output signals, and
    delivering said output signals from said receiver means to computer means and employing said computer means to receive said output signals and determine therefrom vectorial velocity information.

2. The method of claim 1 including
    employing four cycles of three said input gradients to establish four said magnetic field gradient vector moments in a substantially tetrahedral configuration.

3. The method of claim 2 including
    employing said method with said magnetic field gradient moments having a zero value in respect of one of said logical x, y, z coordinate axes, whereby measurement of velocity in two dimensions will be effected.

4. The method of claim 3 including
    applying said main magnetic field on one of said x, y, z axes.

5. The method of claim 4 including
    applying each said input gradients on different ones of said x, y, z axes.

6. The method of claim 4 including determining the gradient moment magnitudes $M_O$ for each of the x, y, and z axes, and employing such information to determine the velocity along each coordinate axis in accordance with the following formulas $$V_x = \frac{\phi_1 - \phi_2 + \phi_3 - \phi_4}{4\gamma M_o}$$

$$V_y = \frac{\phi_1 - \phi_2 - \phi_3 + \phi_4}{4\gamma M_o}$$

$$V_z = \frac{\phi_1 + \phi_2 - \phi_3 - \phi_4}{4\gamma M_o}$$

wherein each of the $\phi$ values are phase angles acquired using a particular tetrahedral gradient vector designated 1, 2, 3, or 4; $M_o$ is equal to the magnitudes of the input orthogonal x, y, z gradient moments so that $M_x = M_y = M_z = M_o$; and $V_x$, $V_y$, and $V_z$ are the orthogonal velocity components.

7. The method of claim 6 including
subsequent to determining said velocity creating an image visually displaying information regarding said velocity.

8. The method of claim 4 including
applying all said input gradients of one cycle of operation within the time period beginning with the first RF pulse and ending with data acquisition by said receiver.

9. The method of claim 4 including
applying said input gradients of one cycle of operation substantially simultaneously.

10. The method of claim 2 including
employing a pulsed RF signal and a cycle of input gradients for each said gradient vector moment created with said pulsed RF signal being prior to each said cycle.

11. The method of claim 1 including
employing five said input gradient cycles.

12. The method of claim 1 including
establishing each of said resulting accumulated gradient vectors moments with vectorial components along each of said x, y, z coordinate axes.

13. The method of claim 11 including
establishing each of said gradient vectors extending from a point at the origin of said coordinate axes to a vertex of a cube.

14. The method of claim 14 including
establishing a strength of said four gradient vectors equal to $G_O$ times the square root of 3 wherein $G_x$, $G_y$ and $G_z$ equals the magnitude of the input gradients along the x, y and z coordinate axes and said inputs are all equal to $G_O$.

15. The method of claim 4 wherein velocity is determined employing the relationship $$V^2 = V_x^2 + V_y^2 + V_z^2.$$

16. The method of claim 1 including
determining the velocity component along a particular coordinate axis x, y or z by the formulas $$V_x = \frac{[(\phi_1 - \phi_n) - (\phi_2 - \phi_n)] + [(\phi_3 - \phi_n) - (\phi_4 - \phi_n)]}{4\gamma M_o},$$

$$V_y = \frac{[(\phi_1 - \phi_n) - (\phi_2 - \phi_n)] - [(\phi_3 - \phi_n) + (\phi_4 - \phi_n)]}{4\gamma M_o},$$

$$V_z = \frac{[(\phi_1 - \phi_n) + (\phi_2 - \phi_n)] - [(\phi_3 - \phi_n) - (\phi_4 - \phi_n)]}{4\gamma M_o},$$

wherein $V_x$, $V_y$ and $V_z$ are the orthogonal velocity components, $\phi_1$, $\phi_2$, $\phi_3$ and $\phi_4$ are each phase angle that are sensitized by tetrahedral gradient vectors and $M_O$ equals the magnitude of the gradient moment along each of the x, y, and z coordinate axes.

17. The method of claim 16 including
employing said method to measure velocity of flow within a specimen that is a biological substance.

18. The method of claim 17 including
employing said method to measure velocity of flow within a human blood vessel.

19. The method of claim 10 including
said input gradient cycles occur before output detection of said RF signals.

20. The method of Claim 15 including
employing said method in perfusion imaging.

21. The method of claim 16 including
employing said method in imaging tissue motion, organ motion, or volume flow, acceleration or higher order motions.

22. The method of claim 1 employing single null phase acquisition during said process to resist phase angle wraparound.

23. A method of vector magnetic resonance imaging comprising
positioning a specimen within a main magnetic field and impinging a plurality of pulsed RF signals and a plurality of input gradient signals thereon in a time coordinated sequence,
delivering to computer means at least four sets of signals sensitized by at least four net gradient vector moments, and
converting said sets of signals into motional-information.

24. The method of claim 23 including
employing four said net gradient vector moments to induce a change in the phase angles from which the velocity can be calculated, and
employing a generally tetrahedral configuration of gradient vectors to induce said phase shifts to determine velocity.

25. The method of claim 23 including
employing four cycles of (a) said pulsed RF signals and (b) three said input magnetic gradients each on one coordinate axis.

26. The method of claim 25 including
employing four said RF pulses each prior to and time coordinated with said input gradient signals to provide four cycles of operation.

27. The method of claim 26 including
establishing said input gradient strength for the x, y and z gradients to generally full strength and optimizing the duration of said gradient with respect to the TE interval.

28. The method of claim 27 including
employing said method to resist wraparound.

29. The method of claim 28 including employing said process to detect low velocities.

30. The method of claim 23 including
determining the change in phase angle by means of the null phase angle.

31. The method of claim 23 including
determining the difference in phase angle by the following equation $$\Delta\phi_i = \phi_i - \phi_n = \gamma M_i V$$

wherein $\Delta\phi_i$ is the specific phase shift corresponding to the i-th tetrahedral gradient; $\phi_i$ is the actual phase angle reconstructed from data sensitized to velocity using the i-th tetrahedral gradient; $\phi_n$ is the null phase angle acquired without any specific velocity sensitization; $\gamma$ is the gyromagnetic ratio; $M_i$ is the vectorial first moment of the tetrahedral gradient; V is the velocity vector that is to be measured or imaged, and i has the value 1, 2, 3, or 4.

32. The method of claim 27 including
employing said method in a high velocity system.

33. The method of claim 27 including
prior to performing the steps of claim 27 establishing intermediate TE intervals and estimating the maximum velocity, and
establishing the gradient strength and determining if the null phase magnitude is greater than $\pi/2$.

34. The method of claim 33 including
employing the following equations to determine the velocity component along each coordinate axis $$V_x = \frac{[(\phi_1 - \phi_n) - (\phi_2 - \phi_n)] + [(\phi_3 - \phi_n) - (\phi_4 - \phi_n)]}{4\gamma M_o},$$

$$V_y = \frac{[(\phi_1 - \phi_n) - (\phi_2 - \phi_n)] - [(\phi_3 - \phi_n) + (\phi_4 - \phi_n)]}{4\gamma M_o},$$

$$V_z = \frac{[(\phi_1 - \phi_n) + (\phi_2 - \phi_n)] - [(\phi_3 - \phi_n) - (\phi_4 - \phi_n)]}{4\gamma M_o},$$

wherein Vx, Vy and Vz are the orthogonal velocity components, $\phi_1$, $\phi_2$, $\phi_3$ and $\phi_4$ are each phase angles that are sensitized by tetrahedral gradient vectors, and $M_O$ equals the magnitude of the gradient moment along each of the x, y, and z coordinate axes.

35. The method of claim 22 including
employing said method in making a velocity determination in only two dimensions.

36. The method of claim 35 wherein only four gradient vectors are employed.

37. The method of claim 32 including
employing said method to measure velocity of flow within a human blood vessel.

38. The method of claim 31 including
employing said method with said net vector moments having a zero value on one of said x, y, z coordinate axes, whereby measurement of velocity in two dimensions will be effected.

39. The method of claim 31 employing said method in perfusion imaging.

40. Apparatus for vector measurement of velocity information comprising magnetic field generating means for establishing a magnetic field on a specimen, RF signal generating means for emitting pulsed RF signals to at least a portion of said magnetic field passing through said specimen, input magnetic field generating means for generating input magnetic gradients along x, y, z axes through said specimen, receiver means for receiving signals emitted from said specimen responsive to said RF pulses and said input gradient pulses and emitting responsive output signals, computer means for receiving said output signals from said receiver means and establishing velocity information relating thereto, said input magnetic field generating means having means for establishing a plurality of input gradients of equal strength net accumulated gradient moments, said computer means having means for employing received information sensitized employing four balanced vector gradient moments of equal net moment strength to establish velocity vectors therefrom, and said computer means having means for determining velocity based upon said velocity vectors.

41. The apparatus of claim 40 including
said computer means having means for establishing said input gradients along said axes substantially simultaneously.

42. The apparatus of claim 41 including
said computer means having means for initiating three said input magnetic gradients with one along each of said x, y, z axes and creating four said gradient vector moments from four cycles of said input magnetic gradients.

43. The apparatus of claim 41 including
said computer means having means for initiating four of said RF pulses time coordinated with said input gradients to establish said four gradient vector moments to sensitize signal information provided to said computer means.

44. The apparatus of claim 40 including
said computer means having means for determining velocity in low velocity specimens.

45. The apparatus of claim 40 including
visual display means for displaying images of said velocity information as received from said computer means.

46. The apparatus of claim 40 including
said computer means having means for establishing said gradient vector moments in a generally tetrahedral configuration.

47. The apparatus of claim 40 including
said computer means having means for employing a null phase angle in determining phase angle changes.

48. The apparatus of claim 46 wherein said computer means has means for determining velocity along each coordinate axis in accordance with the following formulas

FORMULA 6

$$V_x = \frac{[(\phi_1 - \phi_n) - (\phi_2 - \phi_n)] + [(\phi_3 - \phi_n) - (\phi_4 - \phi_n)]}{4\gamma M_o},$$

-continued $$V_y = \frac{[(\phi_1 - \phi_n) - (\phi_2 - \phi_n)] - [(\phi_3 - \phi_n) + (\phi_4 - \phi_n)]}{4\gamma M_o},$$

$$V_z = \frac{[(\phi_1 - \phi_n) + (\phi_2 - \phi_n)] - [(\phi_3 - \phi_n) - (\phi_4 - \phi_n)]}{4\gamma M_o},$$

wherein Vx, Vy and Vz are the orthogonal velocity components, $\phi_1, \phi_2, \phi_3$ and $\phi_4$ are each phase angles that are sensitized by tetrahedral gradient vectors and $M_O$ equals the magnitude of the gradient moment along each of the x, y and z coordinate axes.

49. The apparatus of claim 40 wherein said computer means has means for single null acquisition to reduce phase angle wraparound.

50. The apparatus of claim 47 wherein said computer means has means for providing perfusion imaging.

51. A method of vector magnetic resonance measurement comprising
providing a specimen in a main magnetic field,
imposing time coordinated RF signals on said specimen,
imposing in a time-coordinated manner with respect to said RF signals, magnetic input gradients ons aid specimen to produce magnetic field gradient vector moments that are of equal magnitude and balanced, with the output RF signals which result from such imposition of said magnetic gradients containing (a) the actual phase angle and (b) (in the absence of velocity encoding gradients) the null phase, and
determining velocity by obtaining the actual phase angle from data sensitized to velocity using a given input gradient and separating the null phase therefrom.

52. The method of claim 51 including
when the null phase is generally within the $-\pi/2$ to $\pi/2$ interval calculating the null phase from the data sensitized by magnetic field gradient vector moments.

53. The method of claim 51 including
when the null phase is not within the $-\pi/2$ to $\pi/2$ interval determining the null phase by employing an additional acquisition pulse sequence having an acquisition represented by (0, 0, 0) in said balanced magnetic field gradient vector moment coordinate system.

54. The method of claim 53 including
employing said method in a substantially tetrahedral configuration system, and
said additional acquisition being a fifth acquisition cycle.

55. The method of claim 51 including
employing the following formula in determining velocity, $$V_x = \frac{[(\phi_1 - \phi_n) - (\phi_2 - \phi_n)] + [(\phi_3 - \phi_n) - (\phi_4 - \phi_n)]}{4\gamma M_o},$$

$$V_y = \frac{[(\phi_1 - \phi_n) - (\phi_2 - \phi_n)] - [(\phi_3 - \phi_n) + (\phi_4 - \phi_n)]}{4\gamma M_o},$$

$$V_z = \frac{[(\phi_1 - \phi_n) + (\phi_2 - \phi_n)] - [(\phi_3 - \phi_n) - (\phi_4 - \phi_n)]}{4\gamma M_o},$$

wherein Vx, Vy and Vz are the orthogonal velocity components, $\phi_1, \phi_2, \phi_3$ and $\phi_4$ are each phase angles that are sensitized by tetrahedral gradient vectors and $M_O$ equals the magnitude of the gradient moment along each of the x, y and z coordinate axes.

* * * * *

UNITED STATES PATENT AND TRADEMARK OFFICE
CERTIFICATE OF CORRECTION

PATENT NO. : 5,281,914

DATED : January 25, 1994

INVENTOR(S) : Thomas E. CONTURO and Bruce H. ROBINSON

It is certified that error appears in the above-identified patent and that said Letters Patent is hereby corrected as shown below:

In the Abstract, line 8, -- . -- should be inserted after "moments".

Column 3, line 61, "imagingsystem" should be -- imaging system. --.

Column 8, line 19, the following should be inserted after "reference":
-- square 64 with the complex signal being reconstructed in --.

Column 10, line 32, "G4" should be -- $G_4$ --.

Claim 51, column 19, line 27, "ons aid" should be -- on said --.

Signed and Sealed this

Fourth Day of April, 1995

Attest:

BRUCE LEHMAN

*Attesting Officer*  *Commissioner of Patents and Trademarks*